United States Patent
Ida et al.

(10) Patent No.: US 6,597,757 B2
(45) Date of Patent: Jul. 22, 2003

(54) MARKING APPARATUS USED IN A PROCESS FOR PRODUCING MULTI-LAYERED PRINTED CIRCUIT BOARD

(75) Inventors: Ryoichi Ida, Tokyo (JP); Katsuya Sangu, Tokyo (JP); Katsumi Momose, Tokyo (JP); Wataru Nakagawa, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/266,891

(22) Filed: Oct. 8, 2002

(65) Prior Publication Data

US 2003/0081719 A1 May 1, 2003

(30) Foreign Application Priority Data

Oct. 26, 2001 (JP) ........................ 2001-328514

(51) Int. Cl.[7] ................................ G21K 5/00
(52) U.S. Cl. ........................... 378/34; 378/35
(58) Field of Search ................ 378/34, 35, 205; 361/792–795, 803, 784; 29/830, 833–834, 846; 174/255–256, 250; 257/797

(56) References Cited

U.S. PATENT DOCUMENTS 6,381,005 B1 * 4/2002 Kasumi et al. ............. 355/75

* cited by examiner

*Primary Examiner*—Drew A. Dunn
*Assistant Examiner*—Richard Kim
(74) *Attorney, Agent, or Firm*—Nields & Lemack

(57) ABSTRACT

A marking apparatus for forming alignment marks, which improves the alignment accuracy of each layer in the production of multi-layered printed circuit boards. An X-ray generator 11 irradiates X-rays at a standard mark 50 in a core board 51 of a board 5, and projects the image of the standard mark 50 on a fluorescence screen 12. The image is captured by a visible light CCD camera 13, thereby the position of the standard mark 50 is detected. Using the detected position of the standard mark 50 as an alignment reference, the apparatus irradiates ultra-violet rays at dry film resist layers 55 via mirrors 22 and 23, and imprints the marks emerged on photo masks 24 and 25 on the dry film resist layers 55, respectively.

5 Claims, 2 Drawing Sheets

MARKING APPARATUS USED IN A PROCESS FOR PRODUCING MULTI-LAYERED PRINTED CIRCUIT BOARD

BACKGROUND OF THE INVENTION

1. Field of the Invention

The invention relates to marking apparatus used in a process for producing multi-layered printed circuit board.

2. Related Art

As electric products are becoming lighter, thinner, shorter, smaller and more functional, which is typically shown in cellular phones, a printed circuit board used in such electric products is also becoming more precise. The multi layered printed circuit board has been developed in this trend, the board is manufactured by a so-called build-up method. The multi layered printed circuit board has a core board, on both back and front faces of which resin isolation layers and conductive patterns made of copper or the like are alternately formed and laminated. The layers are conductive through a hole called a via hole that is plated by copper. The conductive patterns are formed by a lithography method using an aligner having a photo mask that is depicted with an original pattern.

When building up the layers, it is very important to adjust the positions of the layers. The new pattern on a new build up layer must be precisely formed at a certain position relevant to the old pattern on the old layer formed already. To accomplish the alignment between the new and old patterns, an alignment mark depicted on the film mask and a board mark (referred to as a standard mark hereinafter) formed on the board are utilized.

Furthermore, the position of the via hole must be precisely determined in relation to the unseen pattern formed on a lower layer.

However, the alignment mark on the core board is invisible because the layer is covered by copper foil before the pattern is formed.

OBJECT OF THE INVENTION

In the prior art, the portion on the build up layer corresponding to on the standard mark on the core board is masked before coating the whole surface of the build up layer with a copper foil and the mask is tore off after the coating in order to avoid covering the portion with the foil.

Further, a hole mark formed through the board is often employed instead of the alignment mark. However, this method needs the troublesome treatment to prevent resin for forming an insulation layer entering into the hole or to remove adhered resin in the hole when forming the insulation layer.

The invention will resolve the problems in the conventional technology described above. Its objective is to provide a marking apparatus that will, by detecting the standard mark by X-ray scanning, allow new alignment marks to be formed on the subsequent outer layers of a multi-layered printed circuit board in relation to the standard mark.

SUMMARY OF THE INVENTION

A marking apparatus of the invention used in a process for producing multi-layered printed circuit boards with a plurality of insulation layers and patterned conductive layers is characterized in having a mark that can be detected by X-rays formed on at least one of said layers of said multi-layered printed circuit board, means for irradiating X-rays on an area containing said mark and detecting the position of the mark, and means for making another mark on an outer layer of said multi-layered printed circuit board.

In said construction, since another alignment mark can be formed on the subsequent outer layers based on the detected mark, it becomes possible to align the news marks to the standard mark. The new alignment mark(s) is typically formed at the position on each layer, corresponding precisely to the detected position of the mark.

The new alignment mark is generally formed on the next conductive layer to be built up, or on the resist used for patterning the conductive layer. In case the dry film resist is used, it is preferred to develop the color of the resist before forming the new alignment mark.

It is further preferred to compose the detection means described above in such order as projecting the X-rayed mark in the multi-layered printed circuit board on a fluorescence screen, thereby making the image of the mark visible, and then photographing the mark by CCD camera to determine its position. Such art has been disclosed by the present assignee in the U.S. application Ser. No.: 09/804, 217.

DETAILED DESCRIPTION OF THE PREFERRED EMBODIMENTS

The invention will now be described in reference to the attached drawings.

Figure 1:
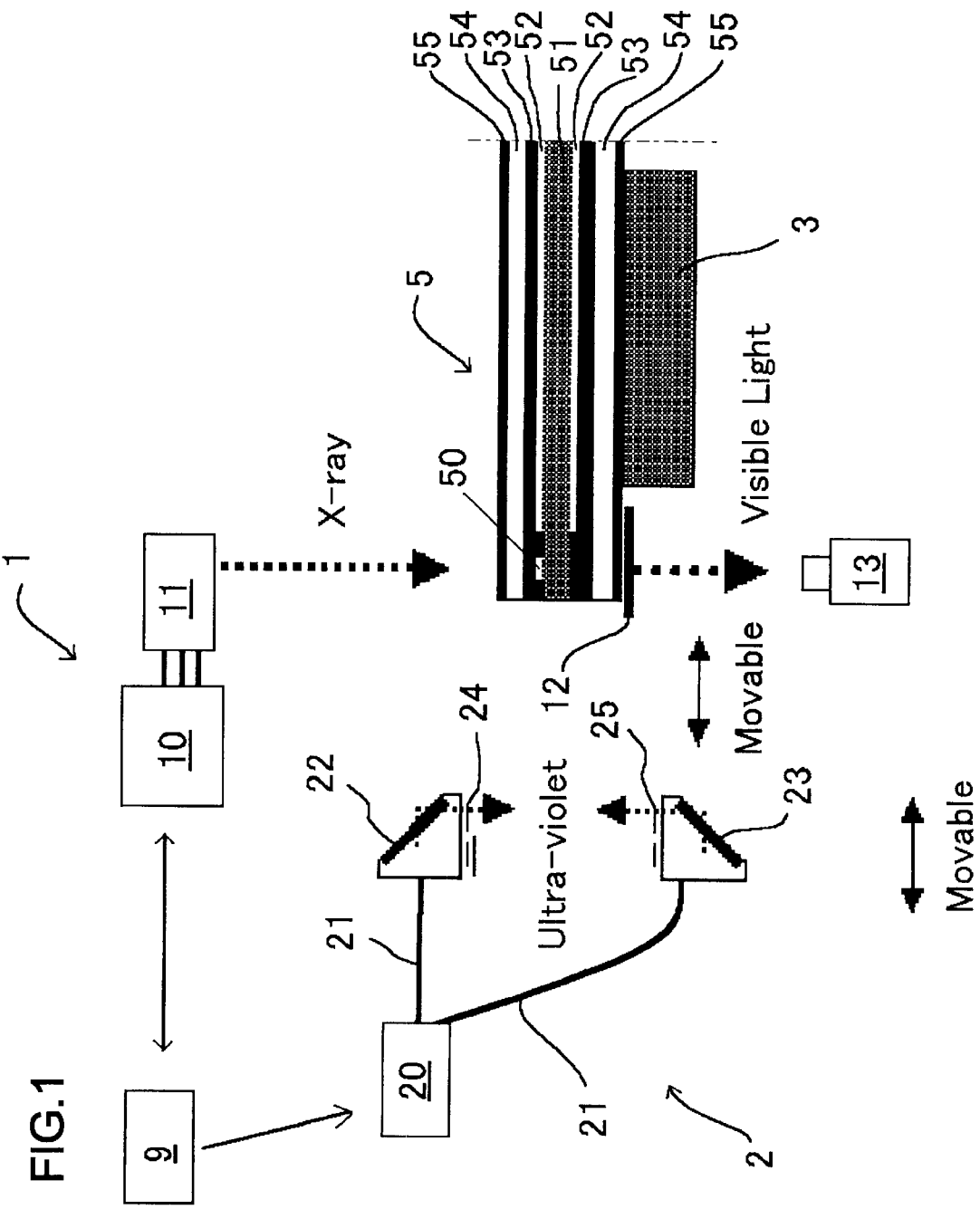
FIG. 1 shows a schematic view of an embodiment of the invention.

Referring to FIG. 1, in this embodiment, another alignment mark is exposed and imprinted by ultra-violet rays on a dry film used for patterning a next layer to be built up.

A board 5, which is transferred from the preceding process, comprises a circuit pattern 52 formed on a core board 51, an insulation layer 53 formed thereon, a build up copper foil layer 54 formed further for forming a next circuit pattern, and finally a dry film resist layer 55 on top. These multi-layer structures are formed on both sides of the board 5, respectively.

In one end of the core board 51 is a copper foil standard mark 50 which is formed simultaneously as the circuit pattern 52 is formed.

The board 5 is transferred from the preceding process in this state, and will be placed on a board stage 3. The board stage 3 is movable in the XYZ directions and rotatable in θ degree angle, that allows the board 5 to move in arbitrary directions.

The marking apparatus of the invention comprises a standard mark detection device 1, a marking device 2, the board stage 3 described above, and a control device 9.

The standard mark detection device 1 is equipped with an X-ray power source 10, an X-ray generator 11, a fluorescence screen 12, and a visible light CCD camera 13.

The X-ray generator 11 is positioned in that it irradiates X-rays in the direction of the board 5. The fluorescence screen 12 is placed behind the board 5, thereby receiving the X-rays transmitted from the board 5.

The fluorescence screen 12 converts the X-rays to visible light, and projects an image created by the X-rays on its rear side. The visible light CCD camera 13 is placed further below the fluorescence screen 12, thereby photographing the image emerged on the rear side of the fluorescence screen 12 and transmitting it to the control device 9 where appropriate image processing takes place.

In the construction described above, the board 5 is placed on the stage 3 and properly positioned within the area of the X-rays to be transmitted from the X-ray generator 11. Then, X-rays are irradiated at the board 5 from the X-ray generator 11, the image of the standard mark 50 is projected on the fluorescence screen 12, the resulted image is photographed by the visible light CCD camera 13 and finally processed by the control device 9 to determine the position of the standard mark 50. The fluorescence screen 12 retracts to a pre-set position upon completion of the mark detection process.

Also, the visible light CCD camera may be replaced with a regular II camera.

The marking device 2 is movable in the XYZ directions, and by the control device 9 it is placed at the position of the standard mark 50, which is previously detected by the standard mark detection device 1.

The marking device 2 comprises an ultra-violet lamp 20, optic fibers 21, mirrors 22 and 23, and photo masks 24, and 25 having alignment marks, respectively. By positioning the mirrors 22 and 23 on the front and back sides of the board 5, respectively, the alignment marks depicted on the photo masks 24 and 25 can be imprinted on the dry film resist layers 55, respectively.

Although this embodiment depicts that the alignment mark is imprinted at the position corresponding precisely to the detected standard mark 50, it may also be imprinted at another position in relation to the position of the standard mark 50.

The ultra-violet rays, being generated by the ultra-violet lamp 20 and split by the optic fibers 21 and 21, are deflected by the mirrors 22 and 23 to the board 5, and simultaneously impinge upon the upper and lower dry film resist layers 55. In this state, the alignment marks created on the photo masks 24 and 25 by the ultra-violet rays are imprinted on the dry film resist layers 55, respectively. The ultra-violet irradiation turns the dry film resists blue. It has enough contrast for the CCD to capture the mark when it is exposed later by the exposure device. The alignment mark will be aligned with an alignment mark of a photo mask used in circuit-patterning process where the build up copper foil layers 54 will be imprinted with a circuit pattern.

Upon completion of the ultra-violet irradiation, the marking device 2 retracts to the originally set position.

The dry film resist layers 55 may be replaced with liquid resist layer.

Besides the method of pattern imprinting by ultra-violet rays as described above, marking by laser or ink-jet, or even by stamping, may also be possible.

Figure 2:
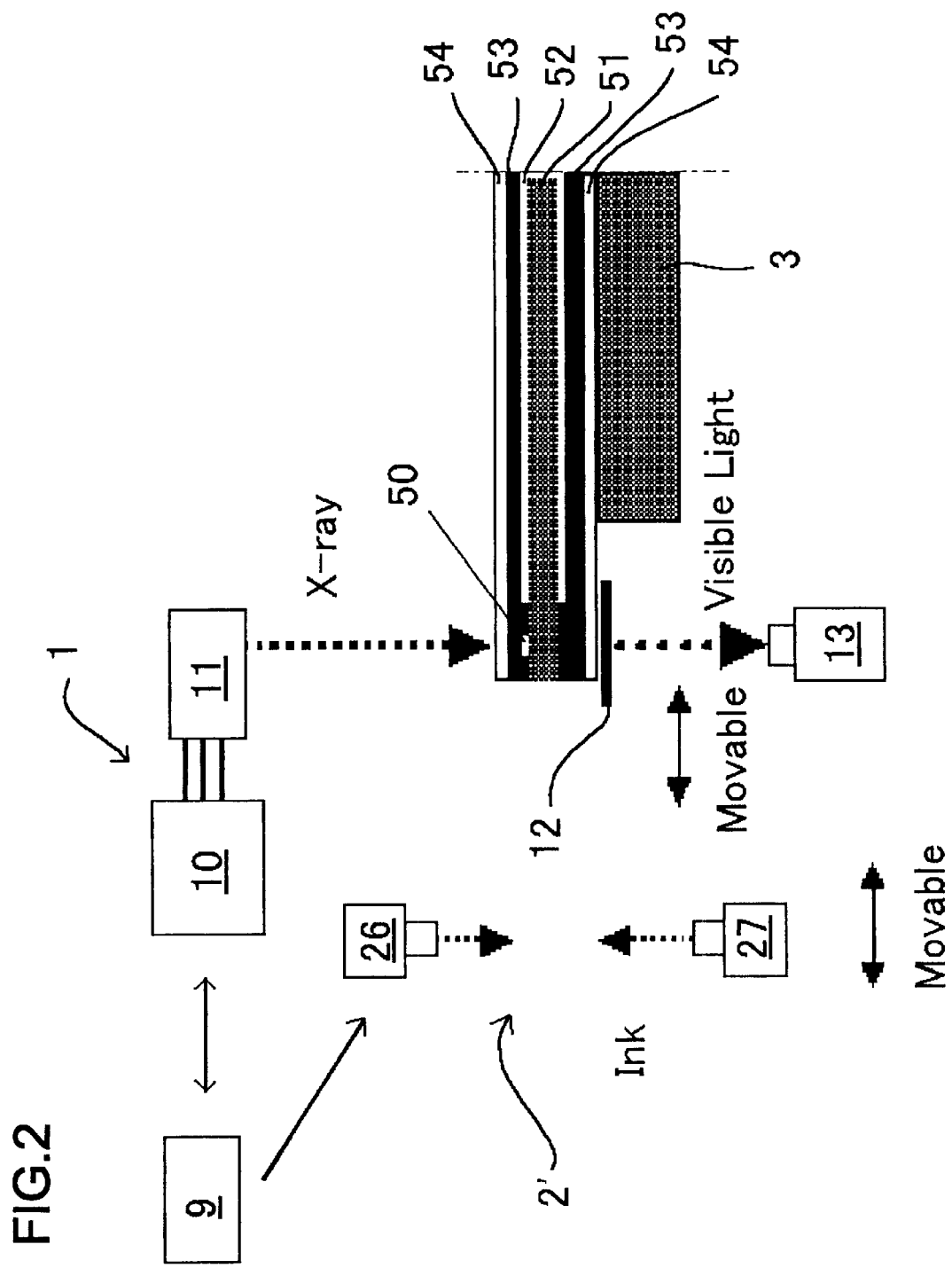
FIG. 2 shows a schematic view of another embodiment of the invention.

FIG. 2 describes an embodiment of said marking apparatus using the ink-jet printing method mentioned above. In this embodiment, the board 5 is built up to the build up copper foil layers 54, on which said mark will be printed directly by the ink-jet printing method.

The composition of the standard mark detection device 1 is the same as in FIG. 1.

A marking device 2' is also movable in the XYZ directions, and is moved by the control device 9 to the position where the standard mark 50 is detected by the standard mark detection device 1.

The marking device 2' is equipped with ink-jet heads 26 and 27 which are positioned on both sides of the board 5, respectively, and spurt ink at the board 5 almost simultaneously to print the mark on the build up copper foil layers 54.

Again in this embodiment, the alignment mark is printed at the corresponding position to the detected standard mark 50, but it may also be printed at another position in relation to the position of the standard mark 50, like the embodiment in FIG. 1.

In the embodiments described in FIGS. 1 and 2, the standard mark detection device 1 and the marking device 2 or 2' are arranged in the upper-lower direction relative to the board 5. However, it is also possible to vertically arrange all of the standard mark detection device 1, the marking device 2 or 2', and the board 5.

Also, instead of moving the standard mark detection device 1 and the marking device 2 or 2', the board 5 may be made movable, or even both of them.

As described above, said marking apparatus of the invention will allow alignment marks to form on said conductive layers or on said resist of dry films, etc. for patterning said next build up layers to be formed in relation to the standard mark 50. Therefore, in the succeeding patterning process, any exposure devices currently in use can be used to render a regular exposure process.

The invention will eliminate such inefficient processes as removing the copper foils corresponding to said mark on said core board after applying said build up layer copper foil, removing the masking tapes applied to prevent copper plate from covering over the mark on the core board in case a copper plating method is used to form the build up layers, and preventing resin from spilling into the hole or removing spilt resin from the hole when forming the insulation layer of the build up layers in order to prevent the hole from being covered in the succeeding plating process in case a hole instead of a pattern is used as the mark in the core board.

The invention will not require purchase of a new exposure device comprising an X-ray generator and an imaging camera. The exposure device currently in use can be used with the apparatus of the invention, therefore a considerable improvement is expected in the capital investment and in the efficiency of multi-layered printed circuit board production.

As described above, said marking apparatus of the invention will allow another alignment mark to form on each layer of a multi-layered printed circuit board in relation to said standard mark, therefore it will be possible to improve the alignment precision needed to produce high quality multi-layered printed circuit boards, and to simplify such production processes and equipment.

What is claimed is:

1. Apparatus for marking multi-layered printed circuit board used in a process for producing multi-layered printed circuit board that includes a plurality of insulated layers and a plurality of conductive layers having a conductive pattern, comprising:

a mark that can be detected by X-rays formed on at least one of said layers of said multi-layered printed circuit board, means for irradiating X-rays on an area containing said mark and detecting the position of the mark, means for making another mark on an outer layer of said multi-layered printed circuit board based on the position of the mark detected.

2. The apparatus of claim 1 wherein:

said means for marking another mark forms said another mark on said conductive layer to be built up next.

3. The apparatus of claim 1 wherein:

said means for marking another mark forms said another mark on the resist used for patterning said conductive layer to be built up next.

4. The apparatus of claim 1 wherein:

said means for marking another mark forms by color development said another mark on the dry film resist used for patterning said conductive layer to be built up next.

5. The apparatus of claim 1 wherein:

said detection means projects the image of said mark in said multi-layered printed circuit board on a fluorescence screen by X-ray irradiation, and photographs the mark by CCD camera.

* * * * *